(12) United States Patent
Schulz et al.

(10) Patent No.: US 6,870,453 B2
(45) Date of Patent: Mar. 22, 2005

(54) MR APPARATUS PROVIDED WITH AN OPEN MAGNET SYSTEM AND A QUADRATURE COIL SYSTEM

(75) Inventors: Volkmar Schulz, Hamburg (DE); Christian Findeklee, Norderstedt (DE); Christoph Guenther Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 22 days.

(21) Appl. No.: 10/135,820

(22) Filed: Apr. 30, 2002

(65) Prior Publication Data

US 2003/0016109 A1 Jan. 23, 2003

(30) Foreign Application Priority Data

May 2, 2001 (DE) .......................................... 101 21 449

(51) Int. Cl.⁷ ................................................ H01F 1/00
(52) U.S. Cl. ...................................... 335/216; 335/299
(58) Field of Search ........................ 335/216, 296–302; 324/318–322; 600/410

(56) References Cited

U.S. PATENT DOCUMENTS

| | | | | |
|---|---|---|---|---|
| 4,567,017 A | * | 1/1986 | Vaidyanathan et al. | ..... 376/417 |
| 5,128,615 A | * | 7/1992 | Oppelt et al. | ............... 324/322 |
| 5,212,450 A | * | 5/1993 | Murphy-Boesch et al. | . 324/322 |
| 5,467,017 A | | 11/1995 | Duerr et al. | |
| 6,441,615 B1 | * | 8/2002 | Fujita et al. | ................. 324/318 |
| 2002/0145428 A1 | * | 10/2002 | Nistler et al. | ............... 324/318 |
| 2003/0100826 A1 | * | 5/2003 | Savelainen | .................. 600/410 |

* cited by examiner

Primary Examiner—Lincoln Donovan
(74) Attorney, Agent, or Firm—Thomas M. Lundin

(57) ABSTRACT

The invention relates to an MR apparatus that is provided with an open magnet system and a quadrature coil system that includes a resonator that is tuned by tuning capacitors on at least one of the two sides of the steady magnetic field, said resonator including two large-area electrical conductors that are situated at a distance from one another and are connected to one another in a number of connection points that are distributed along the circumference, and are also provided with at least two terminals that are distributed along the circumference in order to receive or generate RF magnetic fields that are mutually offset in phase. The invention also relates to a corresponding quadrature coil system.

13 Claims, 4 Drawing Sheets

MR APPARATUS PROVIDED WITH AN OPEN MAGNET SYSTEM AND A QUADRATURE COIL SYSTEM

BACKGROUND

Figure 1:
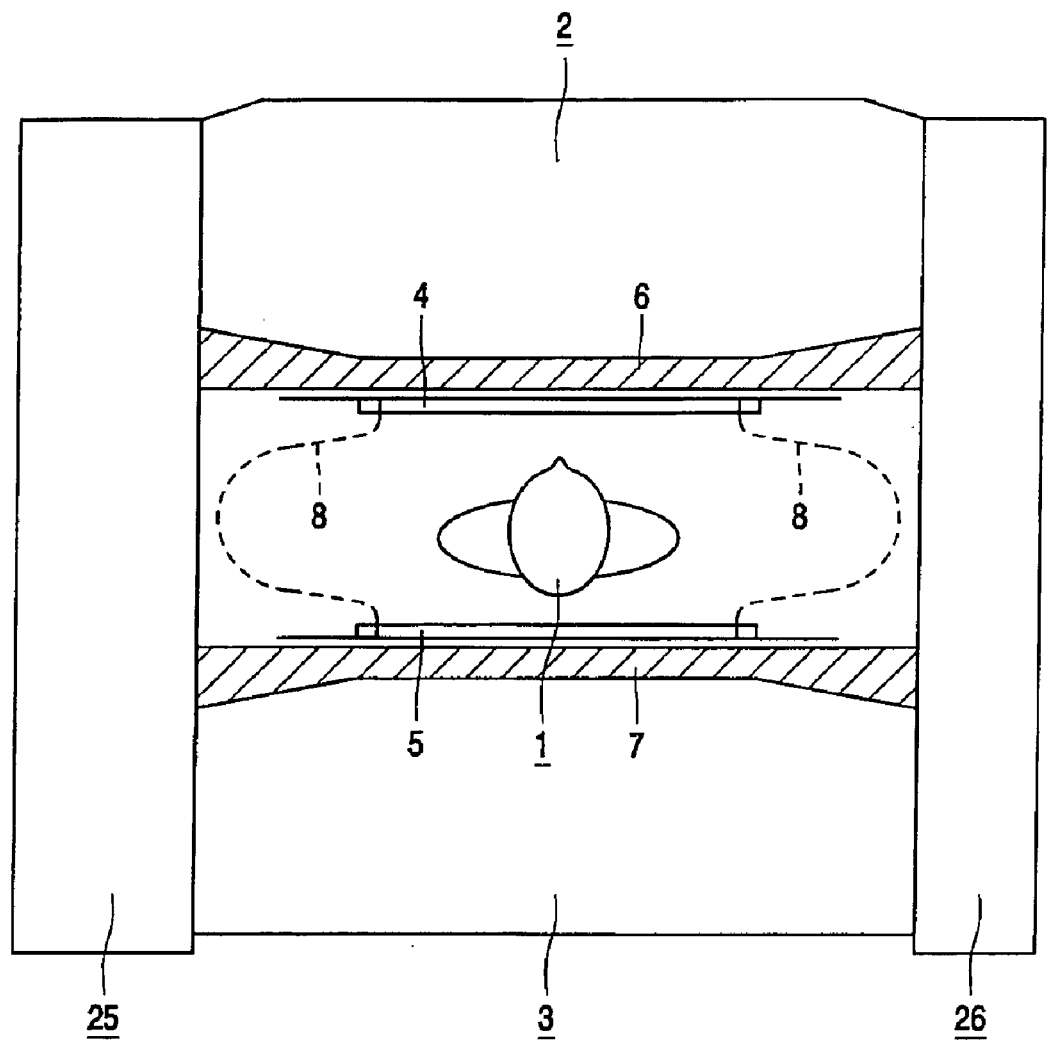

The invention relates to a magnetic resonance (MR) apparatus that is provided with an open magnet system for generating a uniform, steady magnetic field in an examination zone, and with a quadrature coil system for generating or for detecting RF magnetic fields in the examination zone. An "open" magnet system is to be understood to mean herein a magnetic system that generates a (usually vertical) magnetic field between two pole plates of a permanent magnet or between two coil packages of an electromagnet. The examination zone is then open to a high degree, as opposed to the situation in the case of a "closed" magnet system that encloses the examination zone as a cylinder. The invention also relates to a quadrature coil system for such a magnet system.

DE 4 232 884 already discloses an MR apparatus provided with an open magnet system and a coil system for receiving or generating RF magnetic fields. The coil system consists of two similar resonators that are offset relative to one another in the direction of the main magnetic field and are situated to both sides of the examination zone, said resonators being tuned by way of tuning capacitances. Each resonator includes a conductor of large surface area that at the same time serves as an RF shield, and a conductor structure that includes a number of strip-like conductors that are situated in the same plane and are arranged at a distance from one another.

A conductor structure of this kind is only capable of generating or receiving a linearly polarized RF magnetic field in the examination zone. However, it is also possible to supplement each resonator with a second conductor structure that is rotated through 90° relative to the first conductor structure, thus forming a quadrature coil system that generates a circularly polarized field. The two conductor structures must then be situated very near one another, thus giving rise to electrical fields and hence undesirable capacitive coupling between the conductor structures, which phenomena must be compensated again by one or more inductances.

SUMMARY

It is an object of the present invention to provide an MR apparatus with an open magnet system for generating a uniform, steady magnetic field in an examination zone, and also a quadrature coil system that includes, on at least one of the two sides of the examination zone that are offset in the direction of the steady magnetic field, a resonator that can be tuned by tuning capacitances, characterized in that:

the resonator includes, on its side that faces the examination zone, a first, large-area conductor and, on its side that is remote from the examination zone, a second conductor that is situated at a distance from the first conductor, the two conductors are electrically interconnected, at least at the frequency at which the resonator resonates, that the resonator is provided with at least two terminals that are distributed along the circumference in order to receive or generate RF magnetic fields whose phase is mutually offset.

For both polarization directions, therefore, a common large-area conductor is provided (and not two conductor structures that consist of strip-shaped conductors), so that a construction is realized that is considerably simpler than in the known MR apparatus. The term "large-area" as used herein is to be understood to mean a conductor that is extended in two dimensions and has a coherent and continuous (non-interrupted) shape or, when it does not have a continuous shape, behaves practically as a continuous conductor at high frequency.

Because of the large-area conductor, the resonator has a low inductivity, resulting in a higher sensitivity of the quadrature coil system (which means that a given magnetic field in the examination zone can be generated with currents that are smaller or that nuclear magnetization decay in the examination zone induces a higher MR signal on the terminals) than in the known arrangement. The lower inductance of the resonator implies that the tuning capacitances must be larger so as to ensure that the resonator resonates at a given frequency. The higher capacitance causes the maximum voltage that occurs across the tuning capacitances to be smaller than in the known device; this is an additional advantage in respect of patient safety during operation of the quadrature coil system as a transmission coil. Furthermore, in accordance with the invention the RF magnetic field extends parallel to the surface of the large-area conductor, even in the vicinity thereof, whereas the individual conductors in this region in the known device affect the homogeneity of the RF magnetic field.

A spatially adequately uniform RF magnetic field can in principle be generated in the examination zone by means of a single resonator, notably when the resonator has large dimensions and the dimensions of the examination zone are comparatively small in the direction perpendicularly to the resonator. Because of the use of two resonators that are arranged to opposite side, however, a higher spatial homogeneity can be achieved, like in the known MR apparatus.

The claims 2 and 3 disclose alternative embodiments of the invention. The embodiment in conformity with claim 2 has a higher sensitivity (which means that the same current for the same parameters generates a stronger RF magnetic field) and lower losses in comparison with the embodiment that is disclosed in claim 3 and whose advantage resides in the fact that the RF shield and the first conductor are uncoupled from one another.

In the preferred embodiment as disclosed in claim 4 a circularly polarized RF magnetic field can be generated in the examination zone already because of the shape of the first conductor and the arrangement in space of the connection points and the terminals. However, when the field in the vicinity of the resonator is distorted, for example, by components (for example, supports) that are situated at opposite sides of the resonator, the resonator may also have a deviating shape, for example a weakly elliptical shape. It is essential that the configuration in space of the RF magnetic field that can be generated by means of the quadrature coil system is maintained in a plane of the examination zone that extends perpendicularly to the plane of the steady field when the quadrature coil system is rotated through a given angle (for example, 90°) about a central axis.

Claim 5 discloses a feasible arrangement of the tuning capacitances. Unlike in the known MR apparatus, the tuning capacitances now are not provided for only one of the two (mutually perpendicular) polarization directions, but usually for both directions. Consequently, the realization of the resonators is less complex. All tuning capacitances may have the same capacitance. They may also have a different capacitance, however, when it is ensured that the same spatial and electrical configuration is obtained in respect of the terminals.

Instead of realizing the tuning capacitances by way of discrete tuning capacitors connected to the connection points, in conformity with claim 6 a suitable (preferably low-loss) dielectric material may be provided between the two conductors, which material constitutes distributed (tuning) capacitances in conjunction with the conductors. The dielectric material (having a relative dielectric constant $\in_r$ of between 60 and 80) may be segment-shaped. However, a coherent region between the conductors may also be filled with a dielectric material, for example, in the form of a ring or a round or otherwise shaped disc or foil. Tuning can then be realized by way of bores in the dielectric and the field configuration can be influenced by suitable shaping of the dielectric. The heating of the patient by the RF field is insignificant.

In the arrangement that is disclosed in claim 5, voltages of a few kV and correspondingly high electrical field strength may occur in the vicinity of the capacitors across the tuning capacitances in the transmission mode (when the quadrature coil system is used to generate RF magnetic fields). When the patient enters the vicinity of the tuning capacitances, the tissue of the patient may be undesirably heated by the (electrical) RF field. Such heating can be avoided in the embodiment as disclosed in claim 6 because the two conductors of the resonator are conductively interconnected at the connection points. The tuning capacitances are then situated in a region that usually cannot be approached by the patient.

The circumstances in respect of the RF magnetic fields are optimum when the conductors are formed by a continuous, preferably flat plate or layer. However, during an MR examination eddy currents are induced in these conductors due to the low-frequency switching of magnetic gradient fields, which eddy currents on the one hand cause heating of the conductors and on the other hand have an effect on the gradient system and may affect the temporal and spatial configuration of the gradient fields generated.

This undesirable effect can be mitigated by means of the embodiment that is disclosed in claim 7. Therein, the slits should extend relative to the terminals in such a manner that the symmetry is maintained and the bridging capacitors, whose capacitance is significantly higher than that of the tuning capacitances, should be proportioned in such a manner that they constitute a high impedance for the eddy currents, but form practically a short circuit at the resonant frequency of the resonator. The effect of this step is based on the fact that for the frequency range of the gradient sequences the slit conductor is subdivided into a number of small regions in which significantly smaller eddy currents are produced, whereas for the RF currents it still constitutes a single, large, conductive surface as before.

The suppression of the eddy currents is better as the conductor regions formed by the slits are smaller. The more slits are present, however, the more bridging capacitors must be traversed by an RF current. Because the bridging capacitors involve losses, they thus increase the losses in the resonator, so that the quality of the resonator suffers.

In this respect the embodiment as disclosed in claim 9 is more attractive, because the conductive surfaces therein can be subdivided into strips that are so narrow that a single interruption of each strip by way of a slit suffices so as to avoid increased production of eddy currents. When a current is made to flow from one side to the other in the strip direction, it must traverse a bridging capacitor only once. In order to generate a quadrature field it is then necessary to provide the second conductive surface that is provided with the same slit pattern and to rotate the two slit patterns through 90° relative to one another. The outer edges of the conductive surfaces are then connected to one another, so that to the environment they behave as a single, large-area and continuous conductor. It is also possible to connect more than two conductive surfaces to one another in this manner, for example, four surfaces.

The two conductive surfaces can then be realized in the simplest manner in conformity with claim 9.

When a respective resonator is provided to both sides of the examination zone, the two resonators are dominantly inductively coupled, with the result that, in conjunction with the high quality of the resonators, the two coupled resonators no longer resonate at the frequency at which they are tuned, but at two frequencies to both sides of this resonant frequency. This can be avoided by way of the embodiment that is disclosed in claim 11. The connection via the $\lambda/2$ lead ensures that the two resonators are connected in parallel at the resonant frequency, so that only a one common resonant frequency occurs in the vicinity of the Larmor frequency. The parallel connection also offers the advantage that the quality factor of the resonators decreases to the same extent when a patient is introduced into the MR apparatus. If the lead were absent, the quality of the lower resonator would usually decrease more than the quality factor of the upper resonator, because the distance between the patient and the lower resonator is usually smaller than that between the patient and the upper resonator. This unequal change of the quality factor would cause the RF magnetic field that is generated by the two resonators to be more inhomogeneous. (Instead of a $\lambda/2$ lead, of course, a crossed $\lambda$ lead or in general an n $\lambda/2$ lead could be used, where n is an integer).

When the conductors of the resonators are provided with slits, the RF magnetic field can traverse not only the region between the two conductors and the examination zone, but also an external region in which, for example gradient coils may be situated. Consequently, a part of the energy of the quadrature coil system is coupled into the gradient coil system, so that the quality factor of the resonator is drastically reduced. This can be avoided by means of the configuration that is disclosed in claim 12.

Claim 13 discloses a quadrature coil system in accordance with the invention.

DRAWINGS

Figure 2:
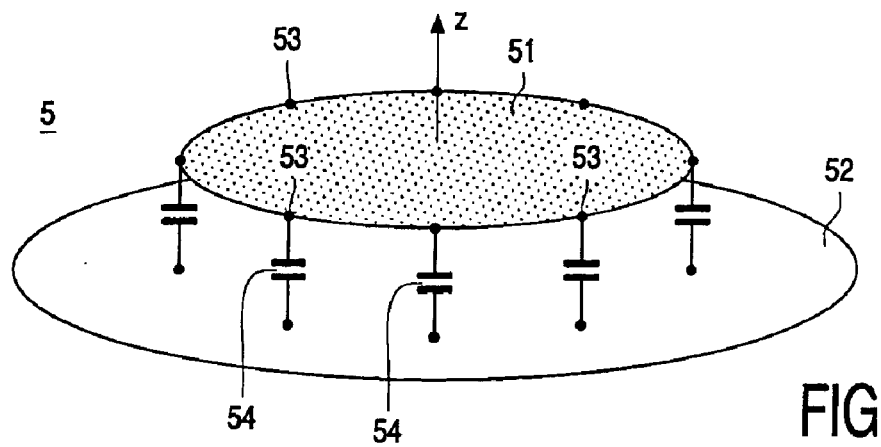
Figure 3:
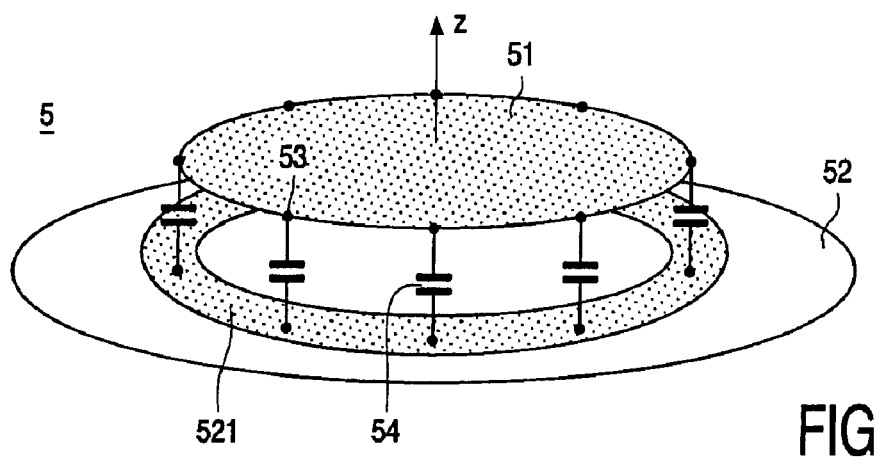
Figure 4:
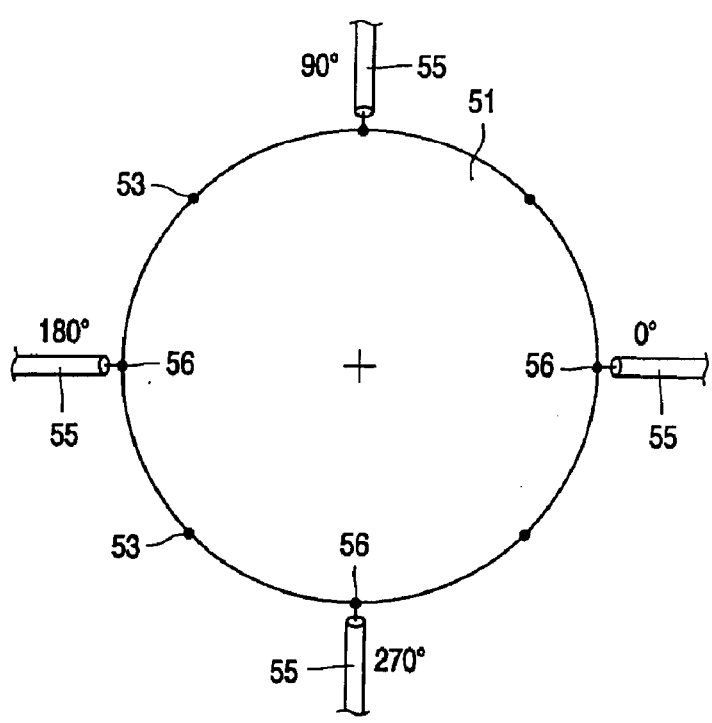
Figure 5:
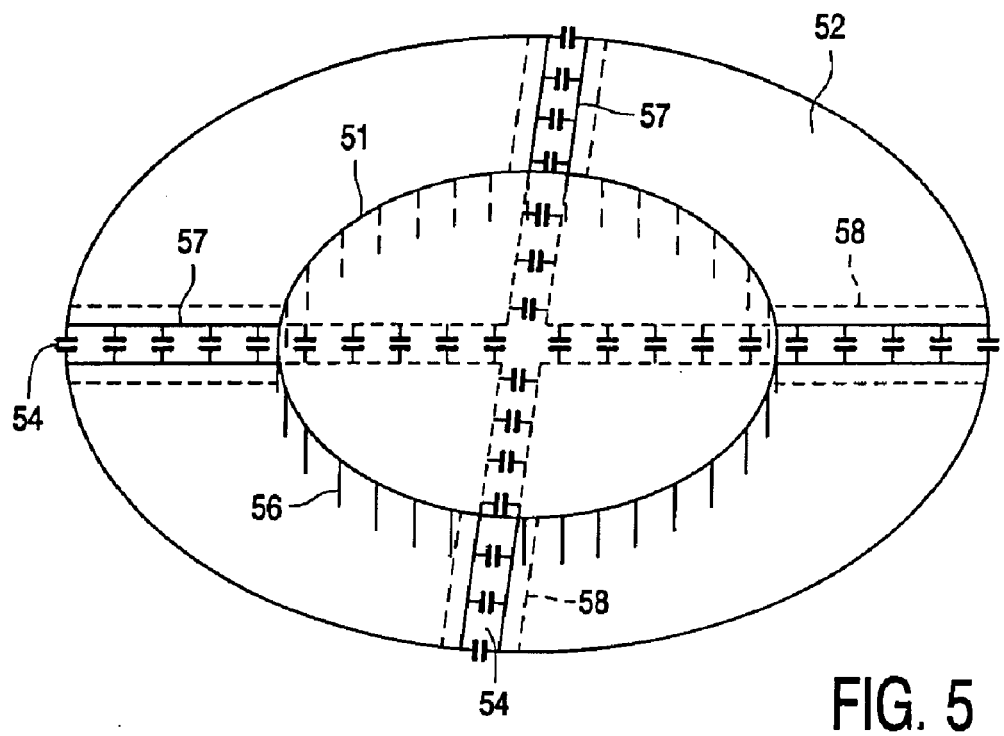
Figure 6:
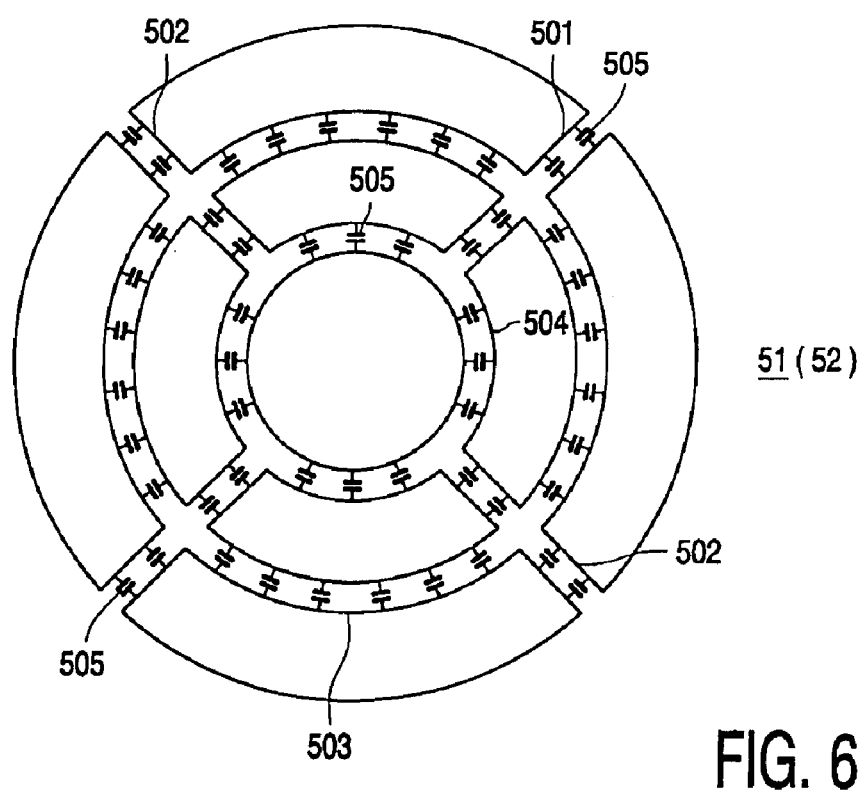
Figure 7:
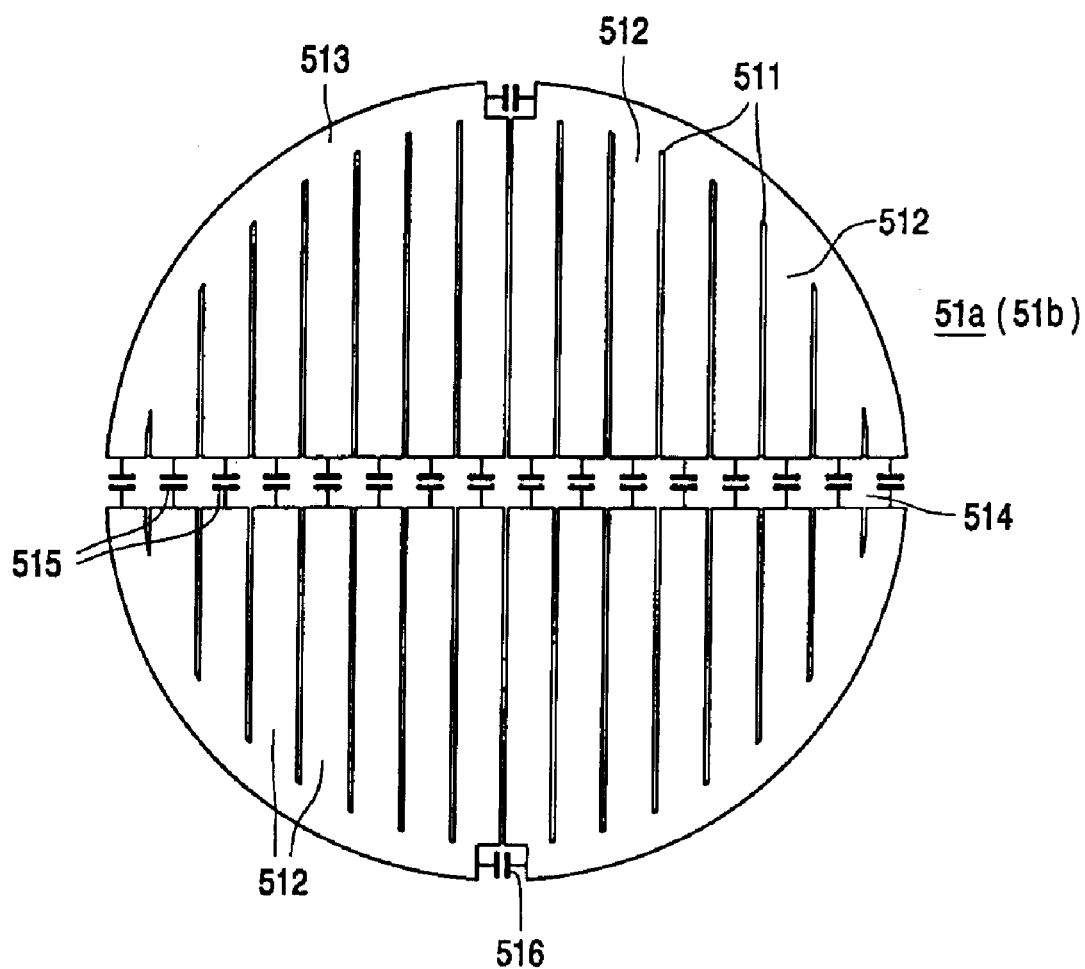
Figure 8:
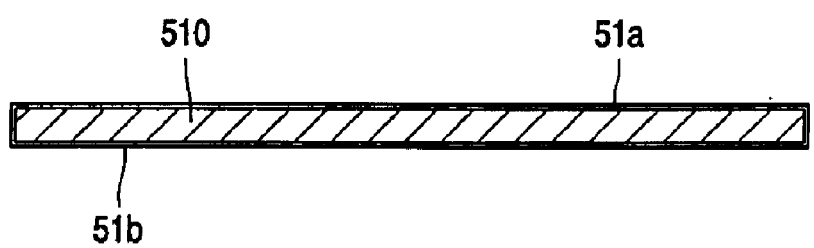

The invention will be described in detail hereinafter with reference to the drawings. Therein:

FIG. 1 shows an MR apparatus provided with the quadrature coil system in accordance with the invention, FIG. 2 shows a first embodiment of a resonator of the quadrature coil system, FIG. 3 shows a further version of this embodiment, FIG. 4 is a plan view of such a resonator and the terminals present, FIG. 5 shows a second embodiment, FIG. 6 is a plan view of a third embodiment of the invention, FIG. 7 is a plan view of one of the two conductors of a fourth embodiment, and FIG. 8 is a side elevation of this conductor.

DESCRIPTION

FIG. 1 shows an MR apparatus that includes a magnet system for generating a uniform, steady magnetic field that extends vertically in an examination zone that is symbolized by a patient 1, that is, in the z direction of the xyz co-ordinate system shown in FIG. 1. The magnet system may be formed by a permanent magnet system; in that case the parts 2 and 3 constitute the poles of such a permanent magnet that are connection to one another via a yoke (not shown). However, the magnet system may also be a preferably superconducting magnet system with coil packets 2 and 3. The Larmor frequency at which the nuclear magnetization precesses in the examination zone is proportional to the strength of the steady magnetic field. The Larmor frequency of protons amounts to approximately 42.6 MHz when the magnetic flux density of the steady magnetic field 1 amounts to 1 Tesla.

The two parts 2 and 3 of the magnet system are interconnected via columns 25, 26 that are situated to the side of the examination zone. At the side of the magnet system 2, 3 that faces the examination zone there are provided gradient coil systems, 6, 7 that are capable of generating a temporally varying magnetic field with an approximately linear gradient of the z component in the x direction, the y direction or the z direction. In the direct vicinity of the two gradient coil systems 6, 7 there is provided a respective resonator 4, 5 that resonates at the Larmor frequency. The two resonators form part of a quadrature coil system that is capable of generating a circularly polarized RF magnetic field of Larmor frequency that extends perpendicularly to the z direction in the examination zone, and is capable of received MR signals (having the Larmor frequency) from the examination zone 1. The resonators, being arranged in a mirror-image fashion relative to the examination zone, advantageously have an identical construction, so that only one resonator will be described in detail hereinafter.

FIG. 2 is a perspective view of the resonator 5. The resonator includes two parallel, flat conductors 51 and 52 that are arranged at a distance of from approximately 2 to 3 cm, have a circular shape and are concentric relative to one another. The conductor 51 that faces the examination zone has a diameter of from approximately 50 to 60 cm and is significantly smaller than the conductor 52. It is thus achieved that the field lines of the RF magnetic field that is generated between the conductors 51 and 52 are closed essentially across the examination zone 1. The conductor 52 at the same time acts as an RF shield.

The two conductors 51 and 52 are connected to one another, via tuning capacitances in the form of discrete tuning capacitors 54, at a number of connection points 53 that are regularly distributed along the external circumference of the conductor 51. The number of capacitors determines the number of quasi-static oscillation modes of the resonator, only the oscillation mode of which that occurs at the lowest frequency thereof being used. The capacitances of the capacitors are proportioned in such a manner that the resonator is in resonance in this oscillation mode at the Larmor frequency.

The number of connection points and the capacitances of the tuning capacitors are chosen to be such that symmetry is obtained relative to two 90° mutually offset axes, or an angular symmetry is obtained, which means that the system has the same appearance after a rotation through 90°. To this end, the number of connection points 53 or the number of capacitors 54 must be divisible by four (without a remainder). In the present embodiment this number amounts to eight, but it is more attractive to use a larger number, for example, 24 or 32, in order to achieve a more uniform current distribution in the conductor 51 and hence a higher homogeneity of the generated magnetic field.

As is shown in FIG. 4, an alternating current of Larmor frequency is applied to four terminals 56 that are regularly distributed along the circumference of the conductor 51, that is via a respective coaxial cable 55, the phase positions being 0°–90°–180° and 270°. The current flows from one terminal 56 to the diametrically oppositely situated terminal 56 as well as via the connection points 53, but not via the 90° spatially offset terminals, because the 90° spatially offset terminals are electrically decoupled from one another.

It is not necessary that four terminals 56 are provided; it suffices when the RF alternating currents are applied to two points that are offset 90° in space relative to one another. However, in the case of loading a more symmetrical field is obtained in the presence of four connection points. However, three terminals that are uniformly distributed along the circumference may also be provided, in that case 120° mutually offset currents then being fed in.

It is not necessary either for the tuning capacitors to have identical capacitances. The capacitances of the connection points that are situated between the terminals 56 may be higher than the capacitances of the connection points that co-operate with the terminals 56, that is, as long as said symmetry is preserved, that is, as long as the arrangement as viewed from the terminals 56 is geometrical and not different electrically. When the intermediate capacitances are higher, a more uniform magnetic field is obtained. It is not necessary either, be it that it is more effective, that the terminals 56 coincide with connection points 53. The connections may also be situated at other points of the conductor 51, that is, for as long as the said symmetry of the terminals is ensured.

Furthermore, it is not necessary either that the conductors 51, 52 have the shape of a circle. Observing said symmetry condition, these conductors may also have a rectangular or octagonal shape. When the RF field in the examination zone is distorted by external components of the system, for example by the supports 25, 26, this problem can be eliminated by means of, for example a weakly elliptical shape. For this configuration it is important, like for all other configurations, that a symmetrical, uniform field configuration is achieved in the examination zone, preferably in its central plane.

The operation of the upper resonator 4 is the same as described with reference to FIG. 4, be it so that the terminals of the two resonators 4 and 5 that are situated one above the other are fed in phase opposition. Consequently, the direction of the RF magnetic fields generated by the two resonators corresponds at all instants. Between these two resonators, however, there is an inductive coupling that ensures that the impedance of these resonators does cot have a maximum at the frequency whereto they are tuned, but at two frequencies to both sides of this frequency.

These undesirable effects are eliminated in that the two resonators are connected to one another at oppositely situated points by way of λ/2 leads 8 that are denoted by dashed lines in FIG. 1. The phase of the current or the voltage at the one end of the λ/2 lead deviates exactly 180° from the phase of the current or voltage at the other end at the Larmor frequency. The connection can be realized in four points that are regularly distributed along the circumference or at two points that are offset 90° relative to one another. It is thus achieved that the two resonators are connected in parallel at the Larmor frequency, so that only a single resonant frequency exists in the vicinity of the Larmor frequency. A further advantage of this parallel connection resides in the fact that the non-uniform attenuation of the resonators, which may occur when the patient is situated, for example nearer to the lower resonator than to the upper resonator, and would affect the homogeneity of the RF magnetic field, is avoided. Both resonators are thus loaded to the same extent, irrespective of their relative position relative to the object 1 to be examined.

FIG. 3 shows an alternative version of the embodiment of FIG. 2. Therein, the conductor 51 is connected to a conductive ring 52 via the tuning capacitors 54, said ring being arranged on an RF shield 521 so as to be insulated therefrom. The current lines of the conductor 51 then are closed essentially over the conductive ring 52. Consequently, the conductor 51 is decoupled from the RF shield 521, even though the latter still influences the variation in space of the RF magnetic field.

However, there are also drawbacks in relation to the embodiment shown in FIG. 2. The flux density between the ring 52 and the plate 51 is higher. Consequently, the magnetic energy in the overall system is greater and the coil is less sensitive, or in other words: the return current via 52 is nearer to the useful current on the plate 51 and hence reduces the sensitivity of the coil. Furthermore, the losses are higher.

In the transmission mode, that is, when an RF magnetic field is to be generated by the resonators 4 and 5, alternating voltages of a few kV may occur across the tuning capacitors 54. Consequently, a strong electrical RF field occurs in the vicinity of the capacitors, which field could heat parts of the body of the patient 1 that are present in the vicinity. Such undesirable heating can be avoided by means of the embodiment that is shown in FIG. 5 and that is based on the recognition of the fact that the tuning capacitors need not necessarily be arranged between the two conductors (notably at the outer edge thereof), but also, for example, in one of the two conductors. Therefore, the outer edge of the conductor 51 is connected to the outer edge of the conductor 52 in the connection points, that is, via wires or conductive strips 56 to said conductor 52, and in the conductor 52 that is remote from the examination zone there are provided two slits 57 that extend radially and perpendicularly to one another and have a width of a few mm, said slits bridging a number of tuning capacitors.

Granted, the tuning capacitors that are provided in the outer edge region are still comparatively readily accessible from the outside, but this is not a problem because the distance to the patient 1 is comparatively large in this region. Moreover, for the same capacitance the voltage drop across the tuning capacitors is smaller in this region. The maximum electrical field strengths, therefore, occur in the central region of the conductor 52 that is situated underneath the conductor 51. In relation to the examination zone these high electrical field strengths are perfectly shielded by the conductor 51. The electrical field, however, can start to interact, via the slits 57, with the gradient coils 7 that are situated therebehind, thus coupling energy into the gradient coils. This undesirable effect can be eliminated by covering, and hence shielding, the slits 57 by means of strips 58 that are situated immediately therebehind and a re denoted by dashed lines in FIG. 5; at this frequency the conductors thus act practically as a continuous, large-area conductor.

The more slits are provided in the conductors 51 and 52, the better the suppression of the eddy currents will be. However, as the number of slits increases, the number of capacitors traversed by the current from one terminal to one of the connection points (not shown in FIG. 6) also increases. Because the bridging capacitors induce losses, the quality factor of the resonators is thus reduced.

The FIGS. 7 and 8 are a plan view and a cross-sectional view of an embodiment in which the eddy currents can also be effectively suppressed but in which the losses remain small, because the current therein flows each time via one bridging capacitor only. The slits 511 in a conductive surface 51a in the ideal case then extend tangentially to the current lines in the (non-slit) conductor plate. It is easier, however, to form a conductive surface that is subdivided (as shown in FIG. 7) into a number of parallel strips 512 of a width of approximately 2 cm by means of slits 511 that have a width of only approximately 1 mm, an outer edge 513 that also has a width of approximately 2 cm then remaining.

The strips 512 are interrupted at the center by an additional slit 514 and bridged at the point of interruption by a respective bridging capacitor 515. Moreover, the edge 513 is interrupted in a few locations and bridged by a capacitor 516. In the absence of such interruptions the outer edge 513 would act as a large annular conductor for the magnetic gradient fields, the temporally varying gradient magnetic field would cause strong currents therein. The capacitors 514 and 516 are again proportioned in such a manner that their impedance is negligibly small at the Larmor frequency and very large in the frequency range of the magnetic gradient field.

In this configuration of the conductor a current flow is possible only in the directions that are predetermined by the slits, via the bridging capacitors. Using this arrangement alone, therefore, no circularly polarized magnetic field can be generated. To this end, a second, identically constructed conductor must be provided; the slit pattern thereof should then be rotated through 90° relative to the pattern shown in FIG. 7. This is indicated in FIG. 8 in which on one side of an insulating carrier there is provided a conductive surface 51a with a slit pattern as shown in FIG. 7 while on the other side there is provided an identically constructed conductive surface 51b whose slit pattern has been rotated through 90° relative to that of the conductive surface 51a. This can be realized most easily by means of a printed circuit board that is provided with a conductive slit pattern on both sides.

The two outer edges 513 of the conductive surfaces 51a and 51b are interconnected. They can be provided with connection points in the same way as described with reference to FIG. 2. Both polarization directions thus also use the tuning capacitors in common. When the terminals are suitably situated, the behavior at high frequency of the two conductive surfaces 51a and 51b together hardly deviates from that of a single, large-area and continuous conductor (not interrupted by slits) with correspondingly arranged connection points and terminals. It is also possible to interconnect more than two conductive surfaces in this way, for example, four surfaces which are then situated one above the other and rotated through 45°.

The RF shield 52 can be constructed in an analogous manner.

The invention has been described with reference to the generating of RF magnetic fields (transmission mode), but the quadrature coil system in accordance with the invention can also be used for the reception of MR signals with 90° mutually offset phase positions. The quadrature coil could in principle also include only one resonator, that is, the upper resonator or the lower resonator. However, in that case the sole resonator should be comparatively large (and the examination zone should be comparatively small in the z direction), if an adequately uniform magnetic field is to be generated thereby in the examination zone.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. An MR apparatus that includes an open magnet system (2, 3) for generating a uniform, steady magnetic field in an examination zone (1), and a quadrature coil system (4, 5) that includes a resonator that is tuned by tuning capacitances (54) on at least one of the two sides of the examination zone that are offset in the direction of the steady magnetic field, in which the resonator is provided, on its side that faces the examination zone, with a first large-area conductor (51) and, on its side that is remote from the examination zone, with a second conductor (52) that is situated at a distance from the first conductor, the two conductors are electrically interconnected, that is, at least at the frequency at which the resonator is in resonance, and the resonator is provided with at least two terminals (56) that are distributed along the circumference in order to receive or generate RF magnetic fields that are offset in phase relative to one another.

2. An MR apparatus as claimed in claim 1, in which the second conductor (52) is also a large-area conductor and has dimensions that are larger than those of the first conductor and hence acts as an RF shield.

3. An MR apparatus as claimed in claim 1, in which the second conductor (52) is situated between the first conductor (51) and an RF shield, the second conductor (52) being insulated from the RF shield and its distance from said shield is significantly smaller than its distance from the first conductor.

4. An MR apparatus as claimed in claim 1, in which the first conductor (51) has a circular shape or the shape of a regular polygon and is electrically connected to the second conductor in a plurality of connection points (53) that are regularly distributed along its circumference, the connection points and the terminals (56) being arranged so as to be offset relative to one another in such a manner that the same configuration is obtained for each terminal.

5. An MR apparatus as claimed in claim 4, in which the two conductors (51, 52) of the resonator are connected to one another, via tuning capacitors (54), at the connection points (53).

6. An MR apparatus as claimed in claim 1, in which a dielectric is provided between the two conductors (51, 52) of the resonator.

7. An MR apparatus as claimed in claim 5, in which the second conductor (52) is subdivided by slits (57) that are bridged by tuning capacitors (54), and in which the two conductors are low-ohmically conductively connected in the connection points.

8. An MR apparatus as claimed in claim 1, in which the conductors (51, 52) are provided with slits (501, 502 . . . 504), at least some of which are bridged by bridging capacitors (505).

9. An MR apparatus as claimed in claim 1, in which at least one of the two conductors (51) includes two conductive surfaces (51a, 51b) that are interconnected at its outer edge so as to be conductive at least at high frequency and are subdivided into a number of narrow strips (512) by slits (511), each of said strips being interrupted in at least one location by a slit (514) that is bridged by a bridging capacitor (515), and in which the pattern of slits that is formed by the slits of the two conductive surfaces are rotated relative to one another.

10. An MR apparatus as claimed in claim 9, in which the conductor includes a printed circuit board (510) that is provided with a slit pattern (51a, 51b) on both sides.

11. An MR apparatus as claimed in claim 1, which apparatus includes two resonators (4, 5), one of which is connected to the other via a conductor (8) of the length $n\lambda/2$, in which $\lambda$ is the wavelength in the conductor at the operating frequency of the resonator and n is a positive integer>0.

12. An MR apparatus as claimed in claim 1, in which at least one of the conductors (52) is provided with slits that are covered by conductor strips (58) on the side that is remote from the examination zone.

13. A quadrature coil system for an MR apparatus that includes an open magnet system for generating a uniform, steady magnetic field in an examination zone, including at least one resonator (4, 5) that is tuned by means of tuning capacitors (54) and wherein:

the resonator is provided on one side with a first large-area conductor (51) and on its other side that is remote from the examination zone with a second conductor (52) that is situated at a distance from the first conductor, the two conductors are electrically interconnected at least at the frequency at which the resonator is in resonance, the resonator being provided with at least two terminals (56) that are distributed along its circumference in order to receive or generate RF magnetic fields that are mutually offset in phase.

* * * * *